METHOD OF INFLUENCING MINORITY CARRIER LIFETIME IN THE SEMICONDUCTOR BODY OF A PN JUNCTION DEVICE

Filed Aug. 28, 1962 5 Sheets-Sheet 1

INVENTORS
WILLIAM H. MILLER
ARTHUR J. RIDEOUT
THOMAS K. WORTHINGTON
BY Everett A. Gartrell
ATTORNEY United States Patent Office 3,195,218

Patented July 20, 1965

3,195,218

METHOD OF INFLUENCING MINORITY CARRIER LIFETIME IN THE SEMICONDUCTOR BODY OF A PN JUNCTION DEVICE

William H. Miller, Poughkeepsie, Arthur J. Rideout, Millbrook, and Thomas K. Worthington, Wappingers Falls, N.Y., assignors to International Business Machines Corporation, New York, N.Y., a corporation of New York Filed Aug. 28, 1962, Ser. No. 219,880

11 Claims. (Cl. 29—25.3)

The present invention is directed to the method of influencing minority carrier lifetime in the semiconductor bodies of PN junction devices and, more particularly, to the reduction of the lifetime of such carriers in semiconductor diodes and transistors.

Semiconductor materials used in diodes and transistors exhibit minority carrier storage effects or lifetime which influence the speed of operation of those devices. To increase the signal-translating speed of such devices, it is necessary to reduce carrier lifetime, particularly in transistors which are to be operated in the saturation mode. Heretofore, lifetime in semiconductor devices has been reduced by diffusion from a surface layer of copper, iron, gold or nickel, by electron bombardment of device surfaces, or mechanically damaging the semiconductor surfaces as with a diamond drill. Such operations have required additional time-consuming and hence more costly steps in the fabrication of a semiconductor device and have not always afforded the degree of lifetime control which is desired for some applications.

Is is an object of the present invention, therefore, to provide a new and improved method of influencing minority carrier lifetime in the semiconductor body of a PN junction device.

It is another object of the invention to provide a new and improved method of reducing minority carrier lifetime in the semiconductor body of a PN junction device, which reduction can be accomplished simultaneously with other standard fabricating steps.

It is a still further object of the invention to provide a new and improved method of controllably reducing minority carrier lifetime in the body of a germanium PN junction device.

It is yet another object of the invention to provide a new and improved method of reducing minority carrier lifetime in the semiconductor body of a PN junction device, which method lends itself to use in the fabrication of such devices by mass-production techniques.

In accordance with a particular form of the invention, in the manufacture of a PN junction device, the method of influencing minority carrier lifetime in the semiconductor body thereof comprises depositing on a surface region of that body an adherent coating having a predetermined thickness and a coefficient of thermal expansion which is different from that of the body but which is insufficient to separate at least part of the coating from the body during temperature cycling. The method also includes maintaining the body and the coating for a period of time at an elevated temperature and subsequently cooling them, thereby producing between them mechanical stresses which establish in the body under the coating mechanical strains that are effective to influence the carrier lifetime to an extent related to the aforesaid predetermined thickness.

The foregoing and other objects, features and advantages of the invention will be apparent from the following more particular description of preferred embodiments of the invention, as illustrated in the accompanying drawings.

*Explanation of precedures of FIGS. 1A–1D*

Figure 1A:
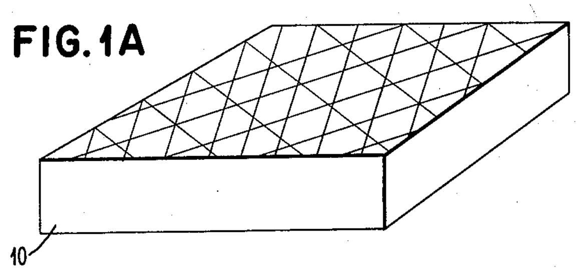
FIGS. 1A to 1D are a series of illustrations which are useful in explaining the manner in which strains are developed in a semiconductor wafer.

Referring now more particularly to FIG. 1A of the drawings, there is represented a semiconductor body 10 comprising a starting wafer that is employed in the fabrication of a semiconductor device. While this body may be of any suitable semiconductor material, it will presently be considered as being a germanium wafer about 10 mils thick and approximately ½" square. The wafer may be one having a low dislocation density such as about 5000–6000 cone or etch pits per square centimeter. The orientation of the face of the body or wafer 10 will be considered as the 111 crystallographic plane. The various planes which come to the surface intersect the latter in a multiplicity of triangles, such as those which are represented diagrammatically and to a greatly enlarged scale in FIG. 1A.

Next there is deposited on a very small surface region of the wafer 10 a thick adherent coating 11 (see FIG. 1B) of a material which has a thermal coefficient of expansion that is different from that of the wafer. The coating 11 should be one which is strong mechanically, should be bonded firmly to the wafer and should be of a material which will not buckle during a temperature cycling to be explained subsequently. A metal oxide such as silicon dioxide or silicon monoxide is useful for this application, the latter being particularly attractive because it forms an impervious coating which anchors tightly to a semiconductor body, may be applied and removed by simple techniques, and has the required strength and thermal coefficient of expansion. Accordingly, the coating 11 will be considered hereinafter as being of silicon monoxide, which has a coefficient of expansion that is different from that of germanium. A suitable material, which is believed to be of the mixed oxide form, is sold as silicon monoxide by the Kemet Company of 30 East 42nd Street, New York, New York, and also by Vacuum Equipment of 1325 Admiral Wilson Blvd., Camden, New Jersey. The silicon monoxide coating 11 may be evaporated through an apertured metal mask on the upper surface of the wafer 10 by well-known techniques, and this deposited coating will bond firmly to the germanium wafer. For the purpose of the present consideration, the silicon monoxide coating 11 will be regarded as a thick one having a thickness of about 0.5 mil or more. Its length and width are such that it occupies only a very small portion of the upper surface of the wafer 10.

Next the wafer 10 and the coating 11 are subjected to a temperature cycling wherein the temperature of the described unit is raised to a level which is above the plastic flow or deformation temperature of about 500° C. for germanium but below its melting point of 958° C. A temperature of about 550° C. is adequate although one in the range of 550–940° C. may be employed with success. The unit may be held at the selected temperature for a period of time which is not critical, such as from about 5 minutes to 280 minutes, after which the unit is cooled to room temperature. This heat treatment operation in conjunction with the difference between the coefficients of thermal expansion of the thick silicon monoxide coating and the germanium wafer develop sufficiently high mechanical stresses between these contiguous members that very high mechanical strains are introduced in the germanium wafer and are effective to damage its crystalline structure. The thickness and the strength of the coating 11 are such that the strains thus developed in wafer 10 cause the coating to separate from the wafer and to tear from the latter a piece of germanium which leaves a substantially triangular recess 12, such as the one represented in FIG. 1C which has an inverted apex at the lowest point in the recess. The separated coating is not shown in FIG. 1C. When the germanium wafer 10 is etched in a suitable solution such as one referred to in the art as a silver etch and containing 44 millilitres of hydrofluoric acid, 88 millilitres of 70% nitric acid, and 100 millilitres of 5% silver nitrate, small triangular etch pits are revealed in the germanium. These etch pits are many in number and indicate the place where a dislocation reaches the surface. No attempt has been made in FIG. 1C to represent them.

From the foregoing explanation, it will be seen that the heating cycle, the difference between the thermal coefficients of expansion of the silicon monoxide and the germanium, the area of the coating 11 in relation to that of the wafer 10, and the thickness of the coating (which imparts additional strength thereto) are such that a multiplicity of dislocations or imperfections in the lattice structure of the germanium are introduced and these include the large triangular recess 12.

Figure 1B:
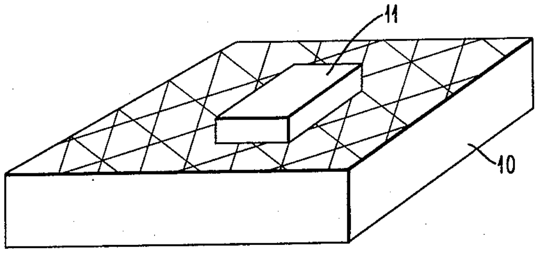
Figure 1C:
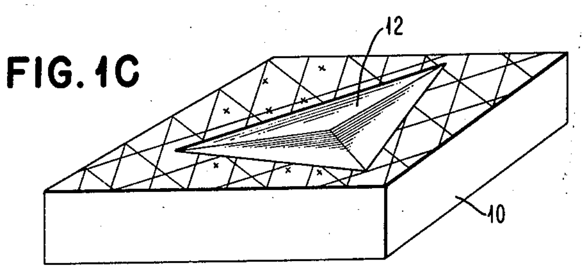

It will now be assumed that a somewhat thinner coating 11 of silicon monoxide has been evaporated on the wafer 10 in the manner represented in FIG. 1B. By a thinner coating, one means a coating which has a thickness of about 0.4 mil or less. The unit comprising the wafer 10 and the coating 11 are then heated for about 5–280 minutes to a temperature in the range of 550–940° C., and hence to a temperature at which plastic deformation of the germanium occurs. The silicon monoxide coating 11 does not completely separate from the wafer 10 as it did in FIG. 1C because the thinner coating is conducive of reduced mechanical stresses, and reduced mechanical strains are produced in the bulk of the semiconductor wafer. Then the silicon monoxide coating 11 is removed from the wafer in the well-known manner by immersing the unit for a period of time in a hydrofluoric acid bath of sufficient concentration to dissolve or disintegrate the coating. Next the upper surface of the unit is etched with the silver etch just mentioned and the resulting top surface presents the appearance represented in FIG. 1D. A multiplicity of triangular etch pits, which constitute dislocations or lattice imperfections in the semiconductor material, are visible in the upper surface of the wafer (when examined under a microscope). Such etch pits are also found in the bulk of the material for a distance which may be a few mils from the upper surface. To simplify the illustration, these etch pits are represented by "*x*" marks 13, 13 in FIG. 1D and succeeding drawings. An equilateral triangular region 14 will be noted on the surface of the wafer corresponding to the perimeter of the triangular recess 12 of FIG. 1C.

Figure 1D:
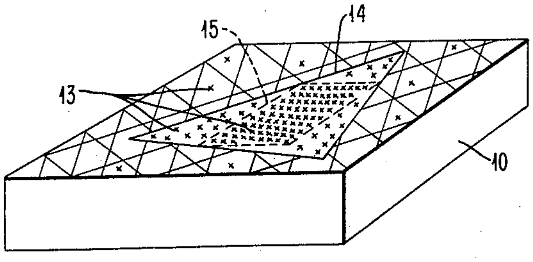

On the wafer surface of FIG. 1D and within the triangular region 14 there is represented a broken-line rectangle 15 corresponding to the outline of the rectangular coating 11 shown in FIG. 1B. This rectangle is represented only to indicate that under the region of the germanium wafer formerly occupied by the silicon monoxide coating 11 there exists a heavy preponderance of dislocations. The dislocation density in the region between the rectangle 15 and the triangle 14 is moderate, and in the region outside of the triangle the dislocations correspond substantially to those which existed in the starting wafer at the outset of the various described operations. The extent of the dislocations created in the manner explained above is related to the thickness of the evaporated silicon monoxide coating 10, and these dislocations may be employed, in a manner to be explained subsequently in connection with FIGS. 2–4, to influence minority carrier lifetime in a semiconductor device.

*Explanation of procedures of FIGS. 2A–2D*

Figure 2A:
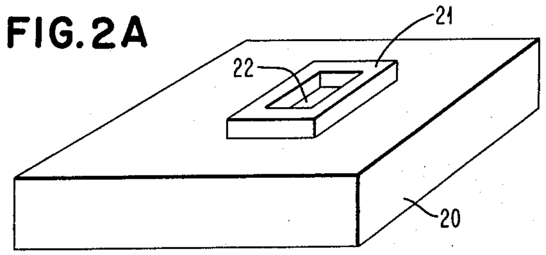
FIGS. 2A to 2D are a series of illustrations representing various steps in the manufacture of a semiconductor diode in accordance with the present invention.
Figure 2B:
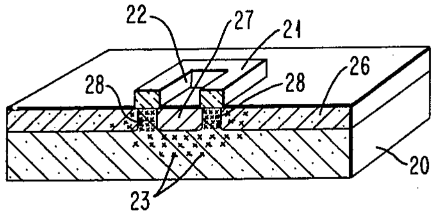

Referring now to FIG. 2A of the drawings, there is represented a wafer 20, which is several mils thick, of a suitable semiconductor material such as germanium of a first conductivity type, such as the P-type, which has an adherent coating 21 of a material such as the metal oxide silicon monoxide deposited thereon as by evaporation. Coating 21 has an aperture 22 therein which may be created in the manner explained in the copending application of Arthur J. Rideout and Thomas K. Worthington, Serial Number 131,771, filed August 15, 1961, entitled "Method of Fabricating a Plurality of PN Junctions in a Semiconductor Body," and assigned to the same assignee as the present invention. Briefly considered, a patch of sodium chloride is first evaporated through an apertured mask on the wafer so that the patch is disposed in the position of the aperture 22. Then the silicon monoxide coating is evaporated through another mask so that the coating 21 occupies the position shown and so that some silicon monoxide rests on the upper surface of the salt patch. The latter is removed by immersing the unit in a suitable solvent for the salt which does not affect the silicon monoxide. This dissolves the salt patch, undermines the silicon monoxide thereover and carries it away but leaves the apertured coating 21 firmly anchored to the wafer 20 as shown.

Figure 2C:
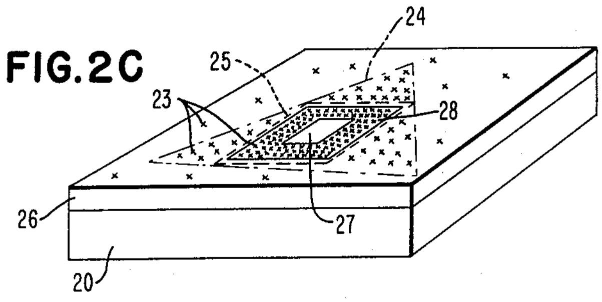
Figure 2D:
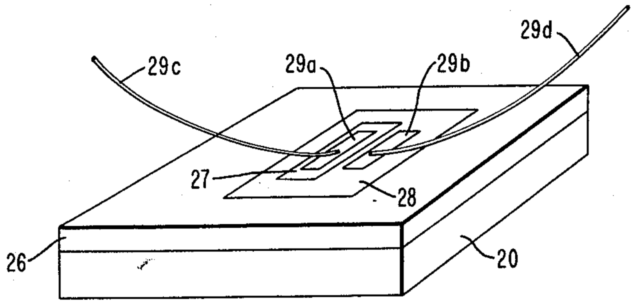

Next the wafer and its coating are placed in a diffusion furnace held at an elevated temperature which is in the plastic deformation range of germanium, and an impurity of a conductivity-determining type opposite to that of the wafer is diffused for a few hours in a well-known manner into the upper surface of the wafer. For some applications, diffusion into a germanium wafer may be conducted for about an hour at a temperature of 650° C. This diffusion step forms the regions 26 and 27 represented in FIG. 2B, which includes a section taken through the middle of the wafer and the silicon monoxide coating. It will be noted that the coating 21 serves as a diffusion mask and prevents the region 28 thereunder from changing its conductivity type. Dislocations are introduced in the semiconductor region under the coating 21 for the reasons previously mentioned and these extend into the bulk of the wafer to a depth related to the thickness of the coating. When the coating is dissolved in the next step, the top surface of the wafer presents the appearance represented in FIG. 2C. Its similarity to FIG. 1D will be manifest. Accordingly, corresponding elements in FIG. 2C are designated by the same reference symbols employed in FIG. 1D but with the number ten added thereto.

In a succeeding operation, suitable metal contacts **29*a* and 29*b* are evaporated in a well-known manner on the regions 27 and 28 as represented, and then the cotacts are alloyed with those regions in a conventional manner. Leads 29*c* and 29*d* are attached to their respective contacts 29*a* and 29*b* by a suitable procedure such as a thermo-compression bonding operation of the type disclosed in Patent 3,006,067 to Anderson et al., granted October 21, 1961, and entitled "Thermo-compression Bonding of Metal to Semiconductors and the Like." Briefly this procedure involves the application of heat and pressure by a chisel-edged tool to the ends of the leads 29*c* and 29*d* resting on the contacts 29*a* and 29*b*** so as to effect good mechanical and electrical bonds at the points of interconnection. It will be recognized that the completed device is a planar diode.

The representations of FIGS. 2A–2D pertain to the manufacture of a single planar diode. It will be understood, however, that in accordance with mass production manufacturing techniques, the wafer 20 would ordinarily be of such size that an array of several hundred diodes would be made thereon simultaneously by procedures corresponding to those described above. After the formation of the diode but before the attachment of the leads, the wafer would be severed in a suitable manner into individual diodes. It will be understood that for simplicity of representation the fabrication of but a single diode has been treated above.

Let us consider now the manner by which the dislocations created in the semiconductor wafer of the described diode influence minority carrier lifetime and improve the operation of the diode for switching and signal-translating purposes. When a semiconductor diode is conducting in its forward direction, there exists a greater than equilibrium density of charge carriers in the semiconductor material. If the voltage on the diode is suddenly switched from the conductive to the nonconductive direction, the stored charged carriers in the semiconductor material continue to flow and manifest themselves in the output circuit of the diode as a sharp spike of reverse transient current. At high operating frequencies, the amplitude and duration of such a spike may be large enough to nullify the essentially unidirectional conductivity characteristic of the diode, thus destroying or greatly impairing the usefulness of the diode as a switch.

To reduce or minimize these spikes of reverse current when the semiconductor diode is turned off, or to increase the upper frequency limits of such a device so that it may be employed in high frequency switching or detecting circuits, it is necessary that the lifetime of these carriers be reduced. The described dislocations which were controllably and intentionally introduced into the semiconductor body by the silicon monoxide film are effective to reduce carrier lifetime and, in turn, to improve the operating characteristics of the diode. The dislocations or lattice imperfections in the semiconductor body serve as traps or recombination centers for minority carriers which migrate into them. The effect of these traps is to reduce the number of minority carriers which are translated through the semiconductor diode. Thus when the voltage on the diode is suddenly switched from a conductive to a nonconductive direction, a trapping effect now takes place with respect to the carriers which would otherwise flow into the diode output circuit when the switching voltage assumes its nonconducting direction. This trapping effect, in turn, reduces minority carrier lifetime and reduces or minimizes the duration and amplitude of the reverse current in the diode. The trapping action greatly improves the switching action of the diode and enhances the value of the latter as a detector or a high speed signal-translating device.

The pulse storage time or turn-off delay of a semiconductor diode, which is constructed in accordance with the techniques explained above, may be controlled by a characteristic of the silicon monoxide coating, namely its thickness. A thick coating creates a greater number of dislocations in the bulk of the semiconductor body than does a thin coating. A larger number of dislocations represent a greater number of traps for minority carriers and these in turn decrease the turn-off delay of the diode. Thus the turn-off delay of a semiconductor device may be controlled by the selection of the thickness of the silicon monoxide coating, the coating and the semiconductor body being subjected to temperature cycling involving at least the plastic deformation of that body as previously explained. The device turn-off delay decreases as the thickness of the silicon monoxide coating is increased. This factor therefore represents a useful tool in the design of a semiconductor device, particularly when the silicon monoxide coating is required in connection with other fabrication operations such as the diffusing operation considered above in connection with FIG. 2D. By proper control of the thickness of a required coating, one is able to achieve at no additional expenditure of time and materials an important and unexpected result, namely control of the lifetime of minority carriers in the semiconductor body and hence the control of the turn-off time of the device.

Other factors which enter into the creation of dislocations in the semiconductor material and hence the control of the turn-off time of a semiconductor device constructed in accordance with the teachings of the present invention are the temperature (above the plastic deformation temperature of the semiconductor) which is employed in the described heat-cycling operation, the length of the last-mentioned operation, and the evaporation time employed in the deposition of the silicon monoxide coating. However, it has been found that these factors are relatively unimportant in relation to the thickness of the selected coating and, as a practical matter, ordinarily may be ignored.

*Explanation of procedures of FIGS. 3A–3E*

Figure 3A:
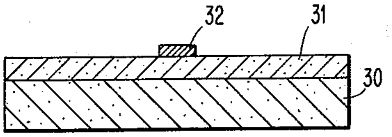
FIGS. 3A to 3E are a series of illustrations depicting procedures in the fabrication of another semiconductor diode in accordance with the invention.

The method of reducing minority carrier lifetime in a semiconductor body is also applicable to the fabrication of a mesa diode. FIG. 3A is a sectional view of a starting wafer 30, which is a few mils thick, of a suitable conductivity type such as the N-type, which has a P-type diffused region 31 established in its upper portion by a conventional diffusion operation. A thin elongated metal contact 32 (see also FIG. 3B) is applied to a portion of the face of region 31 by any well-known means such as by vacuum evaporation through an apertured mask. Such a contact may be a metal film of silver having a thickness in the range of 0.005 to 1.0 mil, this thickness being determined partially by the depth of penetration desired in a subsequent alloying operation. Next there is deposited, as by evaporation through an opening in a suitable mask on the contact 32 and on the surface of a region 31 adjoining contact 32, a silicon monoxide coating 33 which completely encloses the contact. The thickness of the coating will be determined by the extent to which it is desired to control minority carrier lifetime and, ordinarily, that thickness will be in the range of 0.15 to 0.4 mil. During its evaporation operation, the coating 33 bonds intimately to both the metal contact 32 and to a portion of the upper surface of the region 31. It will be understood that in actual practice an area of the upper surface of the region 31 in relation to the area of the superimposed coating 33 is much larger than that which has been shown. The proportions represented in the drawing were selected for convenience of illustration.

Figure 3B:
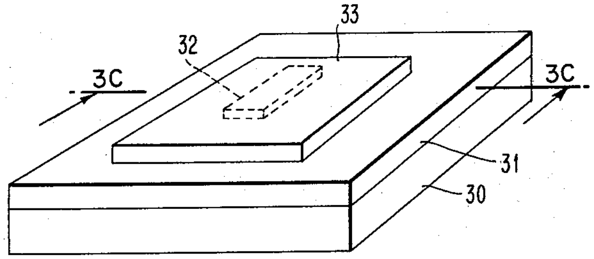
Figure 3C:
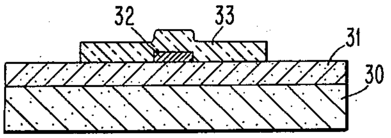
Figure 3D:
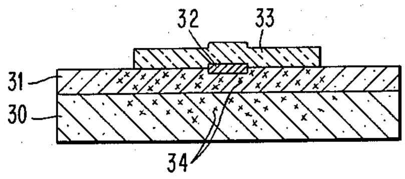
Figure 3E:
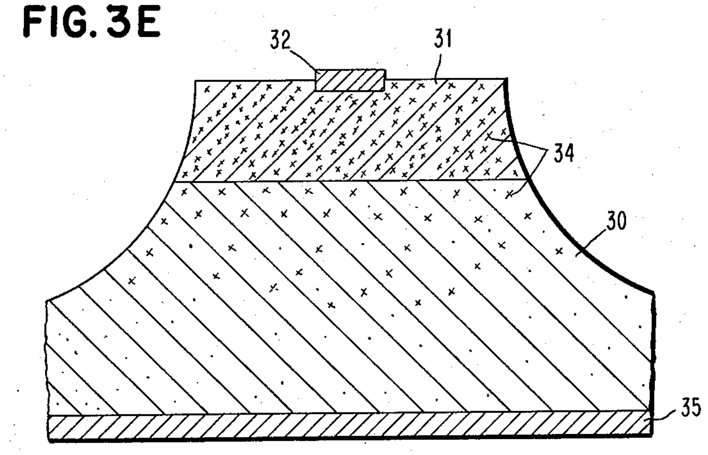

In the next step, the unit of FIG. 3B (shown in section in FIG. 3C) is heated above the eutectic temperature of the semiconductor wafer and the metal contact for about five minutes in a reducing or inert atmosphere in an alloying furnace. After alloying the contact with the adjoining portion of the region 31, the structure presents the appearance represented in FIG. 3D. Plastic deformation caused by the interaction of the oxide coating 33 and the semiconductor material during the temperature cycling of the alloying operation introduces dislocations 34, 34 which extend into the bulk of the material and create traps for minority carriers, as previously explained. During the alloying operation, the coating 33 also serves very usefully as a tough restraining cover which resists surface tension forces that are created by the contact 32 when the latter was molten, and thereby prevents the molten metal from undesirably balling up and creating an unreliable ohmic contact when it cooled. This balling phenomenon, which would otherwise occur but for the coating 32, is believed to be as a result of the surface tension of the liquid metal of coating 32 exceeding the interfacial tension between the liquid and the solid semiconductor wafer. The prevention of this balling is considered in detail in the copending application of Walter E. Mutter, Serial Number 154, filed January 4, 1960, entitled "Semiconductor Devices and Methods of Applying Metal Films Thereto," now U.S. Patent No. 3,067,071 and assigned to the same assignee as that of the present invention.

Thus it will be seen that during the alloying operation, the oxide coating 33 may be employed simultaneously to serve a dual function.

In succeeding operations, the coating 32 is dissolved in a manner explained above in connection with FIG. 2C. Then a film of conventional acid-resistant material such as a wax is applied to the unit except for the upper shoulder portions. When the unit thus treated is subjected to an etching bath comprising a well-known solution of hydrofluoric acid, acetic acid, and nitric acid, a mesa-like structure such as that represented to an enlarged scale in FIG. 3E results (the remaining wax having been removed by a suitable solvent). In a succeeding operation, an ohmic metallic contact 35 is attached to the bottom surface of the wafer 30 as by soldering and a lead (not shown) is suitably attached to the contact 32, thus completing the semiconductor diode.

From the foregoing explanations in connection with FIGS. 2A–2D and 3A–3E, it will be manifest that the method of the present invention for controlling lifetime in a semiconductor device may be employed to great advantage in connection with either diffusing or alloying operations.

*Explanation of procedures for FIGS. 4A–4I*

Figure 4A:
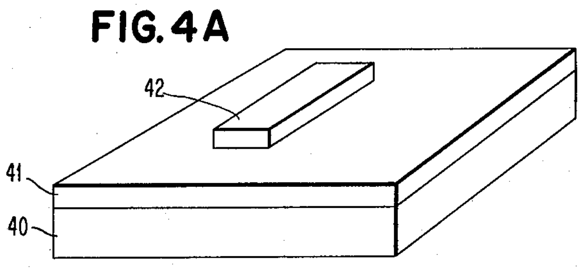
FIGS. 4A to 4I are another series of illustrations representing various steps in the manufacture of a transistor in accordance with the present invention.
Figure 4B:
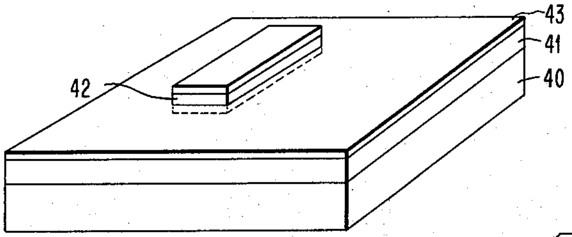

The procedure for controlling lifetime in the semiconductor body of a PN junction device is also useful in the manufacture of transistors. To that end it will be described in connection with the fabrication of an NPN germanium mesa transistor, although it will be understood that the procedure has utility in connection with the manufacture of transistors of other semiconductor materials and other conductivity types. In FIG. 4A of the drawings there is represented an N-type semiconductor wafer 40 which has a P-type diffused region 41 established therein in a conventional manner. The wafer and its diffused region may have a suitable thickness, for example, about 6 mils. Next a salt patch 42 is evaporated on a portion of the exposed upper surface of the region 42 in the manner previously explained in connection with FIG. 2A. Thereafter a thin coating 43 of a metal oxide such as silicon monoxide, preferably having a thickness less than that of the salt patch, is evaporated over the entire top surface of region 41 and over the patch 42 as represented in FIG. 4B. The thickness of coating 43 is preferably in the range of 800 angstroms to about 0.1 mil, and hence is usually less than that of the coatings employed in the manufacture of the diodes of FIGS. 2D and 2E. A coating 0.05 mil thick has proved to be useful for this purpose. When the unit thus far described is immersed in a suitable solvent for the salt patch 42, it dissolves the latter, undermines the small silicon monoxide patch 43*a* thereover and carries it away so as to leave the aperture 44 shown in FIG. 4C.

Figure 4C:
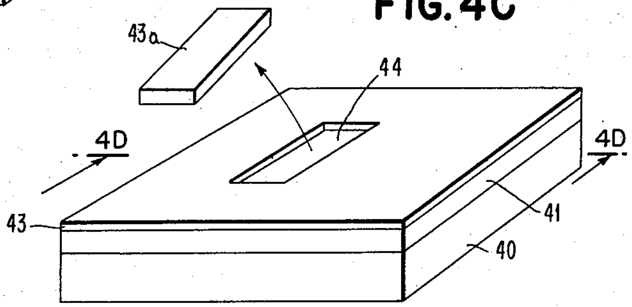
Figure 4D:
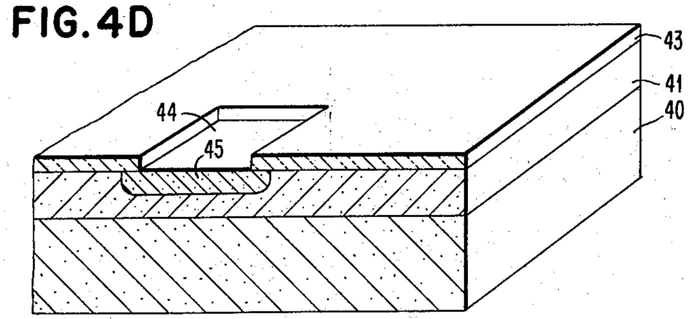
Figure 4E:
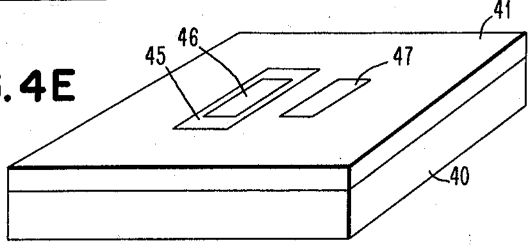

The diffusion of an N-type impurity through the aperture 44 and the silicon monoxide coating 43, which serves as a diffusion mask, is effective to create the emitter region 45 represented in FIG. 4D, which is a sectional view taken on the line D—D of FIG. 4C. Since the coating 43 is thin and also is a continuous one, that is one which covers substantially the entire upper face of the region 43 of the wafer 40, the temperature cycling to accomplish the diffusion of the emitter region does not ordinarily act to introduce sufficient dislocations in the germanium body which influence carrier lifetime. It is believed that this large thin coating serves to distribute any developed mechanical stresses over a large surface area of the germanium and hence greatly reduces the tendency of the heating cycle to establish dislocations in the bulk of the germanium.

Figure 4F:
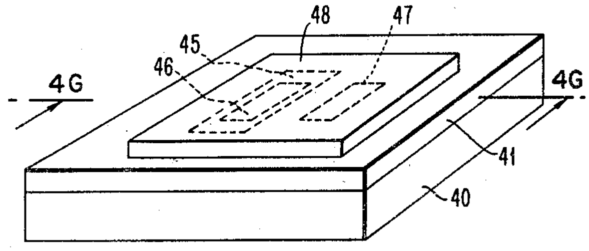
Figure 4G:
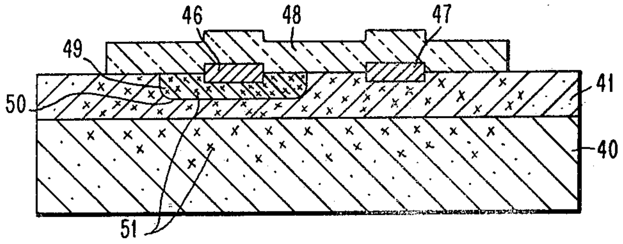
Figure 4H:
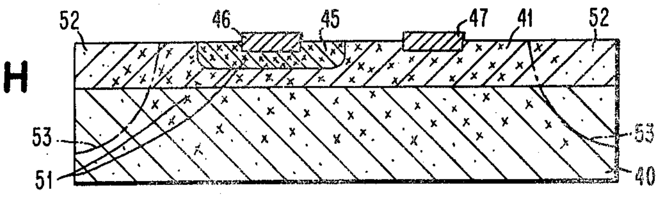
Figure 4I:
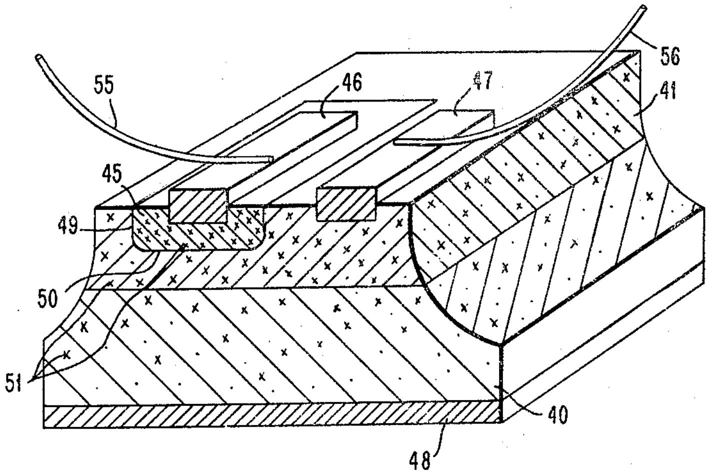

In the next operation the silicon monoxide coating is removed by a suitable solvent so as to expose the entire upper surface of the unit. Thereafter elongated metal contacts 46 and 47 of silver-indium and silver-arsenic alloys, respectively, are deposited as by evaporation through apertured masks (not shown) on the respective emitter region 45 and the base region 41, in the locations indicated in FIG. 4E. To form ohmic contacts with the semiconductor regions thereunder, a suitable coating 48 such as one of silicon monoxide (see FIG. 4F) having a thickness in the range of 0.1 to 0.4 mil is first evaporated over the contacts 46 and 47 and over a portion of the upper surface of the region 43. The thickness which is selected for the coating 48 is determined by the lifetime desired for the minority carriers in at least the collector region of the device. The coating 48 completely encloses the contacts, the P-type emitter region 45, the portion 49 of the junction 50 which is between the emitter and base regions 45 and 41 and which comes to the surface at the upper face of region 41, and over a portion of the upper face of region 41 as represented in FIG. 4G.

Next the unit is heated for about 2–5 minutes to a temperature of about 700° C., and hence to a temperature at which plastic deformation of the germanium takes place. Alloying of the contacts 46 and 47 with the semiconductor regions 45 and 41 thereunder takes place and, when the unit is cooled to room temperature, ohmic emitter and base contacts are established with the respective emitter and base regions. At the same time, dislocations 51, 51 are created in the emitter, base and collector regions of the semiconductor body, for the reasons previously explained, although the extent of these dislocations is not as great in the lower portion of the collector region 40 because of its greater distance from the coating 48. For the reasons previously explained in connection with FIG. 3D, the coating 48 prevents the balling of the contacts 46 and 47 during alloying. Furthermore, the coating advantageously prevents the somewhat volatile arsenic in the contact 46, when the latter is molten, from escaping and creating an undesirable N-type skin on the P-type region 41, which skin would otherwise impair the electrical characteristics of the device. This feature is also described and claimed in the above-identified copending application of Walter E. Mutter. Thus it will be seen that the coating serves a three-fold function; that is, it (1) prevents balling of the emitter and base contacts and (2) the escape of volatile metal during alloying, and (3) it serves, in accordance with the feature of the present invention, to control the establishment of dislocations and the minority carrier lifetime of the transistor.

In succeeding fabrication operations, the coating 48 is dissolved and then the upper shoulder portions 52, 52 (see FIG. 4H) are etched away in a conventional manner to the broken lines 53, 53, thus forming the well-known mesa structure. In a succeeding step, leads 55 and 56 are thermo-compression bonded to the emitter and base contacts 46 and 47, respectively, and a heat dissipating collector terminal 48 is soldered to the region 40 to form a collector terminal, as shown in the perspective view of 4I of half of the transistor. Thereafter the completed transistor may be encapsulated in a conventional manner.

Figure 5:
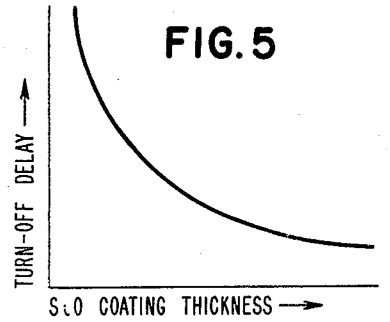
FIG. 5 is a curve employed in explaining the invention.

Referring once again to FIG. 4I, the ability of the silicon monoxide coating and the temperature cycling operation to introduce an adequate number of dislocations 51 in the collector region 40 of the transistor to trap carriers, which carriers would otherwise continue to flow into an output circuit associated with the transistor after its input signal was in a sense to turn the transistor off, shortens carrier lifetime and improves the high-frequency signal-translating capabilities of the transistor. By a proper selection of the thickness of the oxide coating employed on the transistor in the FIGS. 4F and 4G procedures, a designer may in effect utilize that thickness to tailor the transistor to provide a desired turn-off performance. Experimental work on a large number of mesa transistors of the type under consideration has demonstrated that, if the average evaporation rate is held approximately constant, the graph of the turn-off delay vs. silicon monoxide coating thickness has the form represented in FIG. 5. The turn-off delay is in nanoseconds from about 70–200 while the coating thickness is in fractions of a mil from about 0.2 to 0.3. This curve indicates that as the thickness of the silicon monoxide coating is increased, the turn-off delay is decreased, and that the relationship is approximately exponential. Using the median turn-off delay encountered with a large number of devices, empirical curve fitting by machine methods produces the following relationship:

$$T_{\text{off D}}=37{,}430e^{-30.6t}+71 \quad (1)$$

where $T$=turn-off delay in nanoseconds, and
$t$=silicon monoxide coating thickness in mil.

The foregoing expression is valid for values of $t$ between 0.2 and 0.3 mil.

If Equation 1 is solved for $t$, the following expression results:

$$t=\frac{1}{30.6}\log_e\left(\frac{37{,}430}{T_{\text{off D}}-71}\right) \quad (2)$$

Thus Equation 2 permits the calculation of the desired thickness of the silicon monoxide coating to yield a desired turn-off delay. By controlling one or more of the various parameters of the silicon monoxide evaporating step, for example, by controlling the evaporating time, the desired thickness of the film may be established.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In the manufacture of a PN junction device, the method of influencing minority carrier lifetime in the semiconductor body thereof comprising:
depositing on a surface region of said body an adherent coating having a predetermined thickness and a coefficient of thermal expansion which is different from that of said body but which is insufficient to separate at least part of said coating from said body during temperature cycling; and
maintaining said body and coating for a period of time at an elevated temperature and subsequently cooling them, thereby producing between them mechanical stresses which establish in said body under said coating mechanical strains that are effective to influence said carrier lifetime to an extent related to said predetermined thickness.

2. In the manufacture of a PN junction device, the method of influencing minority carrier lifetime in the semiconductor body thereof comprising:
depositing on a surface region of said body an adherent oxide coating having a predetermined thickness and a coefficient of thermal expansion which is different from that of said body but which is insufficient to separate at least part of said coating from said body during temperature cycling; and
heating said body and said coating for a period of time above the plastic deformation temperature of said body but below its melting temperature and subsequently cooling said body and coating, thereby producing between them mechanical stresses which establish in said body under said coating mechanical strains that are effective to influence said carrier lifetime to an extent related to said predetermined thickness.

3. In the manufacture of a germanium PN junction device, the method of influencing minority carrier lifetime in the semiconductor body thereof comprising:
depositing on a portion of a surface region of said body an adherent silicon oxide coating having a predetermined thickness and a coefficient of thermal expansion which is different from that of said body but which is insufficient to separate at least part of said coating from said body during temperature cycling; and
maintaining said body and coating for a period of time at a temperature above 550° C. and subsequently cooling said body and coating to room temperature, thereby producing between them mechanical stresses which establish in said body under said coating mechanical strains that are effective to influence said carrier lifetime to an extent related to said predetermined thickness.

4. In the manufacture of a germanium PN junction device, the method of influencing minority carrier lifetime in the semiconductor body thereof comprising:
evaporating on a surface region of said body an adherent silicon monoxide coating having a thickness in the range of 0.15–0.4 mil;
heating said body and coating for a period of several minutes at a temperature in the range of 550–940° C. and subsequently cooling said body and coating to about room temperature, thereby producing between them mechanical stresses which establish in said body under said coating mechanical strains that are effective to influence said carrier lifetime to an extent related to said predetermined thickness; and
removing said coating with a solution of hydrofluoric acid.

5. In the manufacture of a transistor having emitter, base and collector zones, the method of influencing minority carrier lifetime in the semiconductor body of said transistor comprising:
depositing on a portion of the surface region of at least one of said zones an adherent coating having a predetermined thickness and a coefficient of thermal expansion which is different from that of said body but which is insufficient to separate at least part of said coating from said one zone during temperature cycling; and
maintaining said body and coating for a period of time at an elevated temperature and subsequently cooling them, thereby producing between said portion of said one zone and said coating mechanical stresses which establish in at least a portion of said collector zone mechanical strains that are effective to influence said carrier lifetime to an extent related to said predetermined thickness.

6. In the manufacture of a transistor having emitter, base and collector zones, the method of reducing minority carrier lifetime in the semiconductor body of a said transistor comprising:
evaporating on a surface region of said emitter and base zones an adherent silicon monoxide coating having a thickness in the range of 0.10–0.4 mil and a coefficient of thermal expansion which is different from that of said body but which is insufficient to separate at least part of said coating from said emitter and base zones during temperature cycling; and
maintaining said body and coating for a period of time at an elevated temperature and subsequently cooling them, thereby producing between said emitter and base zones and said coating mechanical stresses which establish in said emitter, base and collector zones mechanical strains that are effective to reduce said carrier lifetime to an extent related to said thickness.

7. In the manufacture of a germanium transistor, the method of influencing minority carrier lifetime in the semiconductor body thereof to control its turn-off delay comprising:
depositing on a surface region of said body an adherent silicon monoxide coating having a thickness in the range of 0.2–0.3 mil; and
maintaining said body and coating for a period of time at an elevated temperature and subsequently cooling them, thereby producing between said body and coating mechanical stresses which establish in said body under said coating mechanical strains that are effective to influence said carrier lifetime to an extent which is inversely related to said thickness and to control said turn-off delay to an extent which is inversely and approximately exponentially related to said thickness.

8. In the manufacture of a germanium NPN mesa transistor, the method of influencing minority carrier lifetime in the semiconductor body thereof to control its turn-off delay comprising:

depositing on a surface region of said body an adherent silicon monoxide coating having a thickness in the range of 0.2–0.3 mil, said thickness being determined by the relationship:

$$t=\frac{1}{30.6}\log_e\left(\frac{37{,}430}{T_{\text{Off D}}-71}\right)$$

where $t$ is the coating thickness in mil, and $T_{\text{Off D}}$ is the desired turn-off delay in the range of 70–200 nanoseconds; and maintaining said body and coating for a period of time at an elevated temperature and subsequently cooling them, thereby producing between said body and said coating mechanical stresses which establish in said body under said coating mechanical strains that are effective to influence said carrier lifetime and to control said turn-off delay.

9. In the manufacture of a PN junction device, the method of influencing minority carrier lifetime in the semiconductor body thereof comprising:

depositing on a surface region of said body a conductor of the same conductivity type as said region;

depositing on said conductor and on said surface region so as completely to enclose said conductor an adherent coating having a predetermined thickness and a coefficient of thermal expansion which is different from that of said body but which is insufficient to separate at least part of said coating from said body during temperature cycling;

heating said body, said conductor and said coating for several minutes to a temperature which is above the plastic deformation temperature of said body and is sufficient to alloy said conductor with said body, and subsequently cooling said body, said conductor and said coating to about room temperature, thereby producing an ohmic contact between said conductor and said region and further producing between said body and coating mechanical stresses which establish in said body under said coating mechanical strains that are effective to influence said carrier lifetime to an extent related to said predetermined thickness; and removing said coating from at least said conductor.

10. In the manufacture of a transistor including a body having emitter and base zones on one surface thereof and having a collector zone, the method of influencing minority carrier lifetime in said zones comprising:

depositing conductors on a portion of said emitter and base zones on said one surface;

depositing on said conductors and on said one surface of said body so as completely to enclose said conductors an adherent coating having a predetermined thickness and a coefficient of thermal expansion which is different from that of said body but which is insufficient to separate at least part of said coating from said one surface during temperature cycling;

heating said body, said conductors and said coating for several minutes to a temperature which is above the plastic deformation temperature of said body and is sufficient to alloy said conductors with said respective emitter and base zones, and subsequently cooling said body, said conductors and said coating to about room temperature, thereby producing ohmic contacts between said conductors and said emitter and base zones and producing between said body and coating mechanical stresses which establish in said body under said coating mechanical strains that are effective to influence said carrier lifetime to an extent related to said predetermined thickness; and removing said coating from at least said conductors.

11. In the manufacture of a PN junction device, the method of influencing minority carrier lifetime in the semiconductor body thereof comprising:

depositing on a portion of a surface region of said body an adherent coating having an opening therein and having a predetermined thickness and a coefficient of thermal expansion which is different from that of said body but which is insufficient to separate at least part of said coating from said body during temperature cycling;

diffusing through said opening an impurity which is of a conductivity type that is opposite to that of said body and at a temperature above the plastic deformation temperature of said body and for a period of time sufficient to create a PN junction, and then cooling said body and coating to about room temperature, thereby producing between said body and coating mechanical stresses which establish in said body under said coating mechanical strains that are effective to influence said carrier lifetime to an extent related to said predetermined thickness;

removing said coating; and alloying ohmic contacts to the adjoining P-type and N-type zones established by said diffusion at said surface region of said body.

References Cited by the Examiner

UNITED STATES PATENTS

| | | | |
|---|---|---|---|
| 2,299,778 | 10/42 | Wissler | 29—446 |
| 2,796,562 | 6/57 | Ellis | 148—1.5 X |
| 3,089,793 | 5/63 | Jordan | 117—106 |

OTHER REFERENCES

Transistor Technology, N.J., Van Nostrand, 1958, vol. II, page 48.

The Solid State for Engineers, Sinnott, N.Y., John Wiley, 1958, page 245.

RICHARD H. EANES, Jr., *Primary Examiner.*